United States Patent
Miyoshi et al.

(10) Patent No.: US 10,871,786 B2
(45) Date of Patent: *Dec. 22, 2020

(54) SUBSTRATE PROCESSING SYSTEM AND METHOD OF DETERMINING FLOW RATE OF GAS

(71) Applicant: TOKYO ELECTRON LIMITED, Tokyo (JP)

(72) Inventors: Risako Miyoshi, Miyagi (JP); Norihiko Amikura, Miyagi (JP); Kazuyuki Miura, Miyagi (JP); Hiroshi Yazaki, Miyagi (JP); Yasuhiro Shoji, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/361,410

(22) Filed: Mar. 22, 2019

(65) Prior Publication Data

US 2019/0301912 A1 Oct. 3, 2019

(30) Foreign Application Priority Data

Mar. 29, 2018 (JP) ................. 2018-064083

(51) Int. Cl.
*G05D 7/00* (2006.01)
*G01F 15/00* (2006.01)
*G01F 1/34* (2006.01)

(52) U.S. Cl.
CPC ............... *G05D 7/00* (2013.01); *G01F 1/34* (2013.01); *G01F 15/002* (2013.01); *G01F 15/005* (2013.01)

(58) Field of Classification Search
None
See application file for complete search history.

(56) References Cited

U.S. PATENT DOCUMENTS

2019/0063987 A1* 2/2019 Hirose .................... G01F 3/221
2019/0212176 A1* 7/2019 Miyoshi .................. G01F 3/36

FOREIGN PATENT DOCUMENTS

JP 2012-032983 A 2/2012

* cited by examiner

*Primary Examiner* — Harshad R Patel
(74) *Attorney, Agent, or Firm* — Studebaker & Brackett PC (57) ABSTRACT

A substrate processing system includes a substrate processing apparatus and a measurement apparatus. The substrate processing apparatus includes a gas supply unit. The gas supply unit includes a flow rate controller and a secondary valve. The secondary valve is connected to a secondary side of the flow rate controller. The secondary valve is opened when a voltage is output from a first controller of the substrate processing system through a wiring. The measurement apparatus measures the flow rate of the gas output from the flow rate controller according to the instruction from the first controller. The measurement apparatus includes a second controller. The measurement apparatus includes a relay provided on the wiring. The second controller is configured to control the relay.

5 Claims, 7 Drawing Sheets

SUBSTRATE PROCESSING SYSTEM AND METHOD OF DETERMINING FLOW RATE OF GAS

CROSS-REFERENCE TO RELATED APPLICATIONS

This application is based on and claims the benefit of priority from Japanese Patent Application No. 2018-064083 filed on Mar. 29, 2018, the entire contents of which are incorporated herein by reference.

TECHNICAL FIELD

Exemplary embodiments of the present disclosure relate to a substrate processing system and a method of determining a flow rate of a gas.

BACKGROUND

In substrate processing, a substrate is disposed in an internal space of a chamber, a gas is supplied to the internal space, and the substrate is processed by the supplied gas. In substrate processing, a flow rate of a gas supplied to the internal space of the chamber is controlled by a flow rate controller. The accuracy of control of the flow rate of a gas influences a result of substrate processing. Therefore, the flow rate of a gas which is output by the flow rate controller is measured.

As one of methods of measuring a flow rate of a gas, a build-up method is used. The build-up method is disclosed in Japanese Patent Application Laid-Open Publication No. 2012-32983. In the build-up method disclosed in Japanese Patent Application Laid-Open Publication No. 2012-32983, a volume of a gas flow channel is determined in advance. A flow rate is determined from a rate of rise in pressure within the gas flow channel, a temperature within the gas flow channel, and the volume determined in advance.

In order to acquire the rate of rise in pressure within the gas flow channel, followings are performed. The valve on the downstream side of the gas flow channel is closed in a state where a secondary valve connected to a secondary side of the flow rate controller is opened. As a result, the pressure of the gas flow channel rises. Then, the secondary valve is closed. The rate of rise in pressure is determined by dividing the rise amount of the pressure by a time length from a time when the valve on the downstream side is closed to a time when the secondary valve is closed.

SUMMARY

In one aspect, there is provided a substrate processing system. The substrate processing system includes a substrate processing apparatus, a measurement apparatus, a first controller, and a wiring. The measurement apparatus is configured to measure a flow rate of a gas used in the substrate processing apparatus. The first controller is configured to control the substrate processing apparatus and the measurement apparatus. The substrate processing apparatus includes a chamber, a gas supply unit, and an exhaust apparatus. The gas supply unit is configured to supply a gas to an internal space of the chamber. The gas supply unit includes a flow rate controller, a primary valve, a secondary valve, and a first gas flow channel. The primary valve is connected to a primary side of the flow rate controller. The secondary valve is connected to a secondary side of the flow rate controller. The first gas flow channel includes a first end, a second end, and a third end. The first end is connected to the secondary valve and the third end is connected to the internal space of the chamber through an on/off valve. The exhaust apparatus is connected to the internal space of the chamber through an exhaust flow channel. The first controller is configured to control opening and closing of each of the primary valve and the secondary valve, designate the flow rate of the gas to the flow rate controller, and instruct the measurement apparatus to measure the flow rate of the gas.

The measurement apparatus includes a second gas flow channel, a third gas flow channel, a first valve, a second valve, one or more pressure sensors, a temperature sensor and a second controller. The second gas flow channel includes a fourth end and a fifth end. The fourth end is connected to the second end of the gas supply unit. The third gas flow channel includes a sixth end and a seventh end. The first valve is connected between the fifth end of the second gas flow channel and the sixth end of the third gas flow channel. The second valve is connected to the seventh end of the third gas flow channel, and is provided to be capable of being connected to the exhaust apparatus. The one or more pressure sensors are configured to measure a pressure within the third gas flow channel. The temperature sensor is configured to measure a temperature within the third gas flow channel. The second controller is configured to control opening and closing of each of the first valve and the second valve and perform measurement of the flow rate based on an instruction from the first controller.

The wiring is connected to the first controller. The first controller is configured to output a voltage through the wiring to open the secondary valve. The measurement apparatus includes a relay provided on the wiring. The second controller is configured to control the relay.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

A calculation accuracy of the rate of rise in pressure within the gas flow channel depends on the above-described accuracy of the time length. Therefore, in a case where the time when the secondary valve is actually closed is delayed from the time when the signal for closing the secondary valve is output, the rate of rise in pressure cannot be accurately determined, and the flow rate of the gas cannot be accurately determined. In view of this background, it is required to suppress delay of control for closing the secondary valve connected to the secondary side of the flow rate controller.

In one aspect, there is provided a substrate processing system. The substrate processing system includes a substrate processing apparatus, a measurement apparatus, a first controller, and a wiring. The measurement apparatus is configured to measure a flow rate of a gas used in the substrate processing apparatus. The first controller is configured to control the substrate processing apparatus and the measurement apparatus. The substrate processing apparatus includes a chamber, a gas supply unit, and an exhaust apparatus. The gas supply unit is configured to supply a gas to an internal space of the chamber. The gas supply unit includes a flow rate controller, a primary valve, a secondary valve, and a first gas flow channel. The primary valve is connected to a primary side of the flow rate controller. The secondary valve is connected to a secondary side of the flow rate controller. The first gas flow channel includes a first end, a second end, and a third end. The first end is connected to the secondary valve and the third end is connected to the internal space of the chamber through an on/off valve. The exhaust apparatus is connected to the internal space of the chamber through an exhaust flow channel. The first controller is configured to control opening and closing of each of the primary valve and the secondary valve, designate the flow rate of the gas to the flow rate controller, and instruct the measurement apparatus to measure the flow rate of the gas.

The measurement apparatus includes a second gas flow channel, a third gas flow channel, a first valve, a second valve, one or more pressure sensors, a temperature sensor and a second controller. The second gas flow channel includes a fourth end and a fifth end. The fourth end is connected to the second end of the gas supply unit. The third gas flow channel includes a sixth end and a seventh end. The first valve is connected between the fifth end of the second gas flow channel and the sixth end of the third gas flow channel. The second valve is connected to the seventh end of the third gas flow channel, and is provided to be capable of being connected to the exhaust apparatus. The one or more pressure sensors are configured to measure a pressure within the third gas flow channel. The temperature sensor is configured to measure a temperature within the third gas flow channel. The second controller is configured to control opening and closing of each of the first valve and the second valve and perform measurement of the flow rate based on an instruction from the first controller.

The wiring is connected to the first controller. The first controller is configured to output a voltage through the wiring to open the secondary valve. The measurement apparatus includes a relay provided on the wiring. The second controller is configured to control the relay.

In the substrate processing system according to the one aspect, in a case of measuring the flow rate, the second controller controls the second valve directly to close the second valve, in a state where the gas is supplied from the flow rate controller to the first gas flow channel, the second gas flow channel, and the third gas flow channel. When the second valve is closed, a pressure within the third gas flow channel rises. In order to determine the rate of rise in pressure, it is necessary that the secondary valve is then closed. The secondary valve is opened by the voltage output from the first controller, and is closed when the output of the voltage is stopped. That is, the secondary valve is a valve controlled by the first controller. Therefore, by transmitting a request to close the secondary valve from the second controller to the first controller by communication, the secondary valve can be closed. However, in a case where a time when the secondary valve is closed by the first controller is delayed from a time when the second controller transmits the request, the second controller cannot accurately obtain the time length of the period during which the pressure within the third gas flow channel rises. In the substrate processing system according to the aspect, a relay is provided on the wiring through which the voltage is output from the first controller, the relay being controlled by the second controller. Therefore, the secondary valve can be instantaneously closed by control of the second controller without the first controller. That is, it is possible to suppress delay of control for closing the secondary valve. Further, according to the substrate processing system of the one aspect, the time length of the period during which the pressure within the third gas flow channel rises can be accurately determined, and the flow rate of the gas is accurately determined based on the time length.

In an exemplary embodiment, the gas supply unit further includes a solenoid valve. The wiring connects the first controller and the solenoid valve to each other. The solenoid valve is configured to supply an air to the secondary valve when the voltage output from the first controller is applied to a solenoid thereof, and stop supplying an air to the secondary valve when the voltage is not applied to the solenoid. The secondary valve is driven by an air from the solenoid valve so that the secondary valve is opened when the air is supplied from the solenoid valve and closed when the no air is supplied from the solenoid valve.

In another aspect, there is provided a method of determining a flow rate of a gas in a substrate processing system according to the aspect or the embodiment described above. The method includes: (i) acquiring a measured value $P_{11}$ of a pressure within the third gas flow channel using the one or more pressure sensors in a first state where the secondary valve and the second valve are closed, and the first valve is opened when a gas is supplied from the flow rate controller to the first gas flow channel, the second gas flow channel, and the third gas flow channel; (ii) raising a pressure in the first gas flow channel, the second gas flow channel, and the third gas flow channel by forming a second state where the second valve is closed by control of the second controller when a gas is supplied from the flow rate controller to the first gas flow channel, the second gas flow channel, and the third gas flow channel; (iii) forming a third state where the secondary valve is closed by the second controller controlling the relay, after the raising a pressure; (iv) acquiring a measured value $P_{12}$ of a pressure within the third gas flow channel and a measured value $T_{12}$ of a temperature within the third gas flow channel in the third state, using the one or more pressure sensors and the temperature sensor; (v) calculating a flow rate of the gas output from the flow rate controller in the raising a pressure, using a value obtained by dividing a difference between the measured values $P_{12}$ and $P_{11}$ by a time length of an execution period of the raising a pressure and the measured value $T_{12}$. The time length of the execution period of the raising a pressure is a time length from a time when the second state is formed to a time when the relay is controlled by the second controller to form the third state.

In an exemplary embodiment, the method further includes of evacuating the first gas flow channel, the second gas flow channel, and the third gas flow channel in a state where the secondary valve, the first valve, and the second valve are opened. The measured value $P_{11}$ is a pressure within the third gas flow channel measured by using one or more pressure sensors in the first state, formed by the second valve being closed by the second controller and the secondary valve being closed by the second controller controlling the relay when a gas is supplied from the flow rate controller to the first gas flow channel, the second gas flow channel, and the third gas flow channel, from the state formed in the evacuating.

In an exemplary embodiment, the method further includes: (vi) forming a fourth state where the second valve is opened and the first valve is closed, from the third state; (vii) forming a fifth state where the second valve is closed, from the fourth state; (viii) acquiring a measured value $P_{13}$ of a pressure within the third gas flow channel using the one or more pressure sensors in the fifth state; (ix) forming a sixth state where the first valve is opened, from the fifth state; (x) acquiring a measured value $P_{14}$ of a pressure within the third gas flow channel using the one or more pressure sensors in the sixth state. In the calculating a flow rate of the gas, a flow rate Q of the gas output from the flow rate controller in the second state is determined by executing an arithmetic operation of the following Expression (1).

$$Q=(P_{12}-P_{11})/\Delta t \times (1/R) \times (V/T) \qquad (1)$$

In Expression (1), $\Delta t$ is a time length of an execution period of the raising a pressure. R is a gas constant. $(V/T)$ includes $\{V_3/T_{12} \times (P_{12}-P_{13})/(P_{12}-P_{14})\}$. $V_3$ is a default value of a volume of the third gas flow channel.

Hereinafter, various embodiments will be described in detail with reference to the accompanying drawings. In the drawings, the same or equivalent portions are denoted by the same reference symbols.

Figure 1:
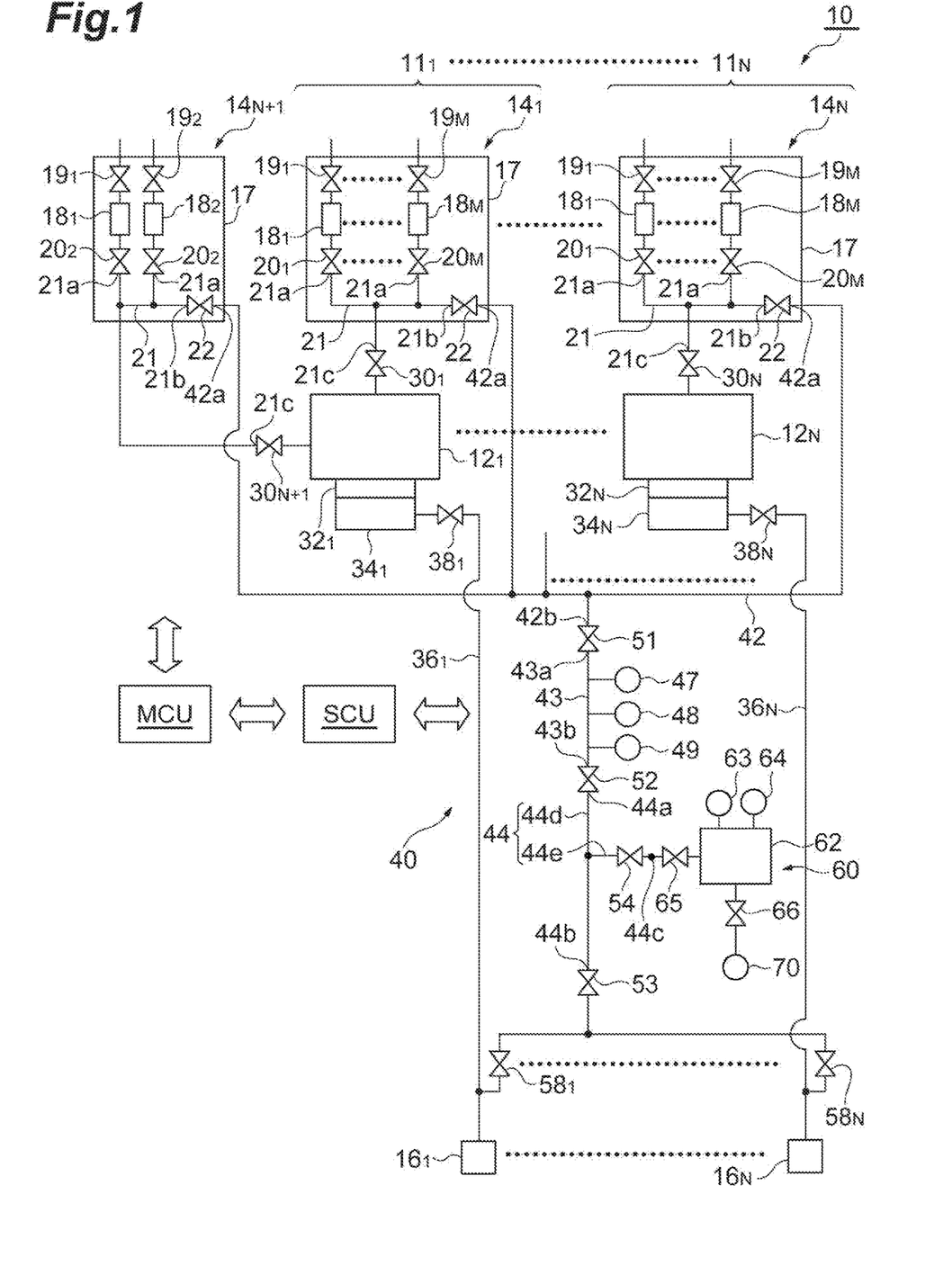
FIG. 1 schematically illustrates a substrate processing system according to an exemplary embodiment.

FIG. 1 schematically illustrates a substrate processing system according to an exemplary embodiment. The substrate processing system 10 shown in FIG. 1 includes a plurality of substrate processing apparatuses 11 and a measurement apparatus 40. The number of the substrate processing apparatuses 11 in the substrate processing system 10 is N. "N" is an integer equal to or greater than 2. In the following description and the drawings, in a case where one element among a plurality of elements of the substrate processing system 10 is referred to, the subscript of "i" is appended to the end of a reference symbol indicating the element. For example, in a case where one substrate processing apparatus among the plurality of substrate processing apparatuses 11 is referred to, a reference symbol of "$11_i$" is used. Here, i is an integer equal to or greater than 1. It should be noted that the number of the substrate processing apparatuses in the substrate processing system 10 may be one.

The substrate processing system 10 includes a plurality of chambers 12, a plurality of gas supply units 14, and a plurality of exhaust apparatuses 16. In the substrate processing system 10, each of the number of chambers 12 and the number of exhaust apparatuses 16 is N. In addition, in the substrate processing system 10, the number of gas supply units 14 is (N+1). The substrate processing apparatus $11_i$ includes a chamber $12_i$, a gas supply unit $14_i$, and an exhaust apparatus $16_i$ which have the same number i.

A substrate is accommodated in the internal space of each of the plurality of chambers 12 for substrate processing. Each of the plurality of gas supply units 14 is configured to supply a gas to the internal space of the corresponding chamber among the plurality of chambers 12. Specifically, in the substrate processing system 10, the gas supply units $14_1$ to $14_N$ are configured to supply a gas into the chambers $12_1$ to $12_N$, respectively. In addition, the gas supply unit $14_{N+1}$ is configured to supply a gas into the chamber $12_1$. It should be noted that the gas supply unit $14_{N+1}$ may also be configured to supply a gas to the internal space of the chamber other than the chamber $12_1$ among the plurality of chambers 12.

Each of the plurality of gas supply units 14 includes a housing 17, a plurality of flow rate controllers 18, a plurality of primary valves 19, a plurality of secondary valves 20, and a first gas flow channel 21. Each of the plurality of gas supply units 14 may further include a valve 22. Each of the gas supply units $14_1$ to $14_N$ includes M flow rate controllers 18, M primary valves 19, and M secondary valves 20. M is an integer equal to or greater than 2. In addition, the gas supply unit $14_{N+1}$ includes two flow rate controllers 18, two primary valves 19, and two secondary valves 20. In the following description and the drawings, in a case where one element among a plurality of elements of each of the plurality of gas supply units 14 is referred to, the subscript of "j" is appended to the end of a reference symbol indicating the element. For example, in a case where one flow rate controller among the plurality of flow rate controllers 18 is referred to, the reference symbols of "$18_j$" is used. Here, j is an integer equal to or greater than 1. Further, even in a case where one related element among a plurality of related elements of the substrate processing system 10 related to a plurality of elements of each of the plurality of gas supply units 14 is referred to, the subscript of "j" is appended to the end of a reference symbol indicating the related element. It should be noted that the number of the flow rate controllers, the number of the primary valves, and the number of the secondary valves in each of the plurality of gas supply units 14 of the substrate processing system 10 may be one.

Figure 2:
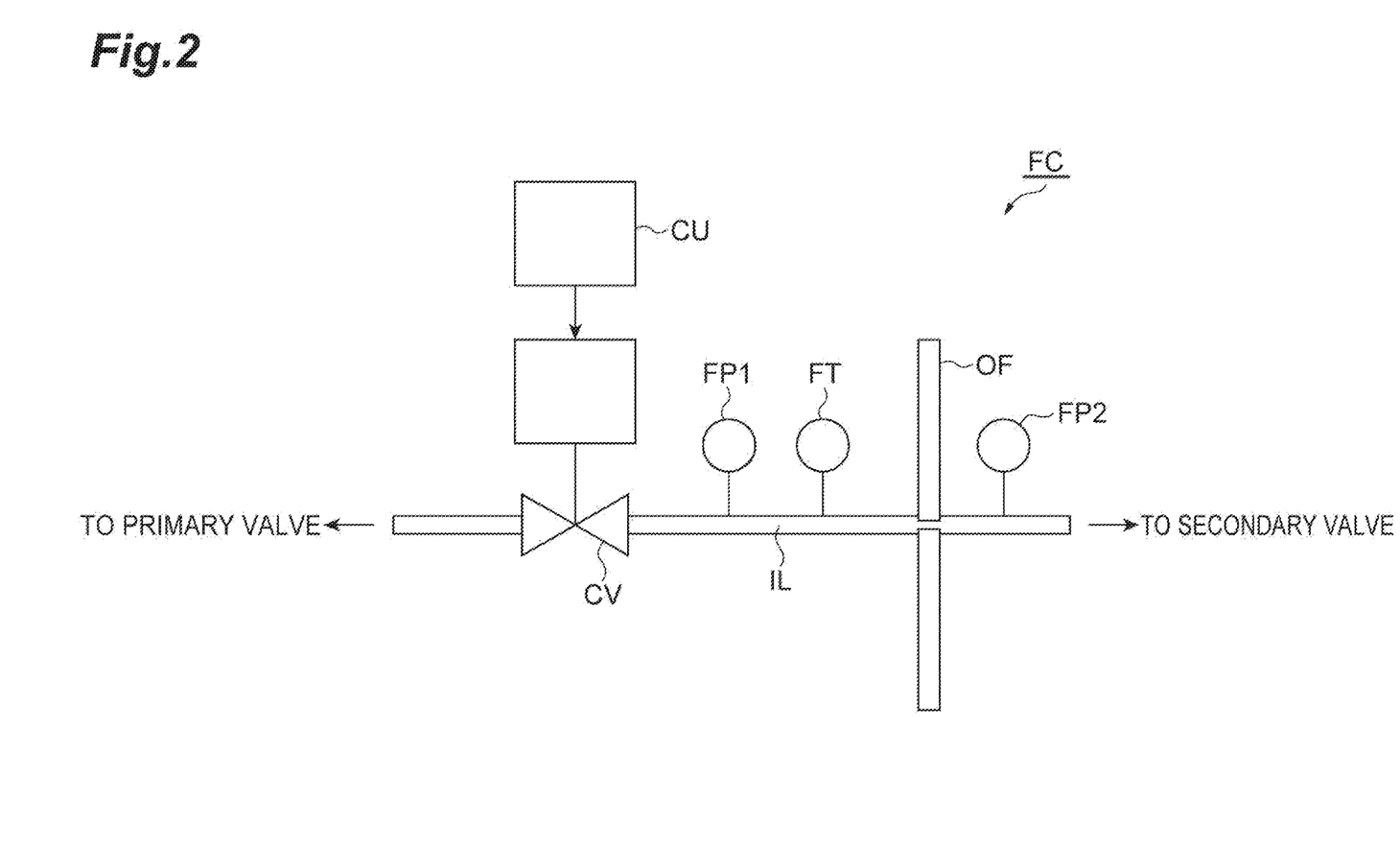
FIG. 2 illustrates a structure of a pressure control-type flow rate controller of an example.

The housing 17 is a container providing an internal space. The plurality of flow rate controllers 18 are accommodated within the housing 17. Among the plurality of flow rate controllers 18 of the plurality of gas supply units 14, a flow rate controller other than the flow rate controller $18_1$ of the gas supply unit $14_{N+1}$ is a mass flow controller or a pressure control-type flow rate controller. FIG. 2 illustrates a structure of a pressure control-type flow rate controller of an example. A flow rate controller FC shown in FIG. 2 may be used as a flow rate controller other than the flow rate controller $18_1$ of the gas supply unit $14_{N+1}$ among the plurality of flow rate controllers 18 of the plurality of gas supply units 14.

The flow rate controller FC includes a control valve CV, a flow channel IL, an orifice member OF, a pressure sensor FP1, a temperature sensor FT, and a pressure sensor FP2. One end of the flow channel IL is connected to the primary valve. The other end of the flow channel IL is connected to the secondary valve. The orifice member OF partially reduces the cross-sectional area of the flow channel IL between the one end and the other end of the flow channel IL. At the upstream side of the orifice member OF, the control valve CV is provided on the flow channel IL. The pressure sensor FP1 is configured to measure a pressure within the flow channel IL between the control valve CV and the orifice member OF, that is, on the primary side of the orifice member OF. The temperature sensor FT is configured to measure a temperature within the flow channel IL between the control valve CV and the orifice member OF, that is, on the primary side of the orifice member OF. In addition, the pressure sensor FP2 is configured to measure a pressure within the flow channel IL between the orifice member OF and the other end of the flow channel IL.

In the flow rate controller FC, in a case where the pressure on the primary side (upstream side) of the orifice member OF is two or more times the pressure of the flow channel IL on the downstream side (secondary side) of the orifice member OF, the degree of opening of the control valve CV is controlled by a controller CU so as to reduce a difference between a set flow rate and a flow rate which is determined from the measured value of a pressure acquired by the pressure sensor FP1. On the other hand, in a case where the pressure on the primary side (upstream side) of the orifice member OF is smaller than two times the pressure of the flow channel IL on the downstream side (secondary side) of the orifice member OF, the degree of opening of the control valve CV is controlled by the controller CU so as to reduce a difference between a set flow rate and a flow rate which is determined from a difference between the measured value of a pressure acquired by the pressure sensor FP1 and the measured value of a pressure acquired by the pressure sensor FP2. The flow rate controller FC may not include the pressure sensor FP2 in a case of being used in a state where the pressure on the primary side (upstream side) of the orifice member OF is two or more times the pressure of the flow channel IL on the downstream side (secondary side) of the orifice member OF.

Reference is made to FIG. 1 again. As described above, among the plurality of flow rate controllers 18 of the plurality of gas supply units 14, each of the flow rate controllers other than the flow rate controller $18_1$ of the gas supply unit $14_{N+1}$ may be a mass flow controller. The mass flow controller has a temperature sensor, as is the case with a pressure control-type flow rate controller. The flow rate controller 18, of the gas supply unit $14_{N+1}$ is a mass flow controller, and may have a function of vaporizing a liquid.

The plurality of primary valves 19 are connected to the primary sides of the plurality of flow rate controllers 18, respectively. The plurality of primary valves 19 are provided within the housing 17. Each of primary valves other than the primary valve $19_1$ of the gas supply unit $14_{N+1}$ among the plurality of primary valves 19 is connected to a corresponding gas source provided on the primary side (upstream side) thereof. The primary valve $19_1$ of the gas supply unit $14_{N+1}$ is connected to a liquid source provided on the primary side thereof. The plurality of secondary valves 20 are connected to the secondary sides of the plurality of flow rate controllers 18, respectively. The plurality of secondary valves 20 are provided within the housing 17.

The first gas flow channel 21 includes a plurality of first ends 21a, a second end 21b, and a third end 21c. The number of the first ends of the first gas flow channel 21 is M. In a case where each of the number of the primary valves, the number of the flow rate controllers, and the number of the secondary valves in the gas supply units is one, the number of the first ends 21a of the first gas flow channel 21 may be one.

The plurality of first ends 21a are connected to the plurality of secondary valves 20, respectively. That is, the plurality of first ends 21a are connected to the secondary sides of the plurality of flow rate controllers 18, respectively, through the plurality of secondary valves 20. The first gas flow channel 21 includes a plurality of flow channels extending from the plurality of first ends 21a, and the plurality of flow channels are connected to a common flow channel. One end of the common flow channel of the first gas flow channel 21 is the second end 21b. A portion of the first gas flow channel 21 extending from the plurality of first ends 21a to the second end 21b is provided within the housing 17. The third end 21c is provided outside the housing 17. A flow channel including the third end 21c is connected to the common flow channel of the first gas flow channel 21. The third end 21c is connected to the internal space of the corresponding chamber among the plurality of chambers 12 through the corresponding on/off valve 30 (301). The valve 22 is connected to the second end 21b. The valve 22 is provided within the housing 17.

The substrate processing system 10 includes a plurality of pressure control valves 32, a plurality of turbo-molecular pumps 34, a plurality of exhaust flow channels 36, and, a plurality of valves 38. Each of the plurality of substrate processing apparatuses 11 includes one pressure control valve 32, one turbo-molecular pump 34, one exhaust flow channel 36, and one valve 38. The number of each of the pressure control valve 32, the turbo-molecular pump 34, the exhaust flow channel 36, and the valve 38 is N. In a case where the substrate processing system 10 includes one substrate processing apparatus, the number of each of the pressure control valves 32, the turbo-molecular pumps 34, the exhaust flow channels 36, and the valves 38 may be one.

Each of the plurality of pressure control valves 32 is, for example, an automatic pressure control valve. A pressure control valve $32_i$ is configured to adjust the pressure of the internal space of a corresponding chamber $12_i$. An exhaust flow channel $36_i$ is connected to the internal space of the corresponding chamber $12_i$ through a pressure control valve $32_i$ and a turbo-molecular pump $34_i$. A valve $38_i$ is provided on the exhaust flow channel $36_i$. At the downstream side of the valve $38_i$, the exhaust apparatus $16_i$ is connected to the exhaust flow channel $36_i$. Each of the plurality of exhaust apparatuses 16 may be, for example, a dry pump.

The substrate processing system 10 further includes a first controller MCU. The first controller MCU may be a computer device including a processor such as a CPU, a storage device such as a memory, an input device such as a keyboard, a display device, and the like. The first controller MCU executes a control program stored in the storage device by the processor, and controls the plurality of the substrate processing apparatuses 11 and the measurement apparatus 40 in accordance with recipe data stored in the storage device.

Specifically, the first controller MCU designates a set flow rate of the gas to a selected flow rate controller $18_i$. The flow rate controller $18_i$ outputs the gas of the flow rate according to the designated set flow rate. The first controller MCU controls the plurality of primary valves 19, the plurality of secondary valves 20, the plurality of valves 22, the plurality of on-off valves 30, the plurality of valves 38, the plurality of valves 58, the plurality of exhaust apparatuses 16, the plurality of pressure control valves 32, and the plurality of turbo-molecular pumps 34. In addition, the first controller MCU is configured to instruct the measurement apparatus 40 to measure the flow rate of the gas output from the flow rate controller $18_i$. An instruction to measure the flow rate of the gas from the first controller MCU to the measurement apparatus 40 is performed, for example, by communication with a second controller of the measurement apparatus 40 which will be described later.

Figure 3:
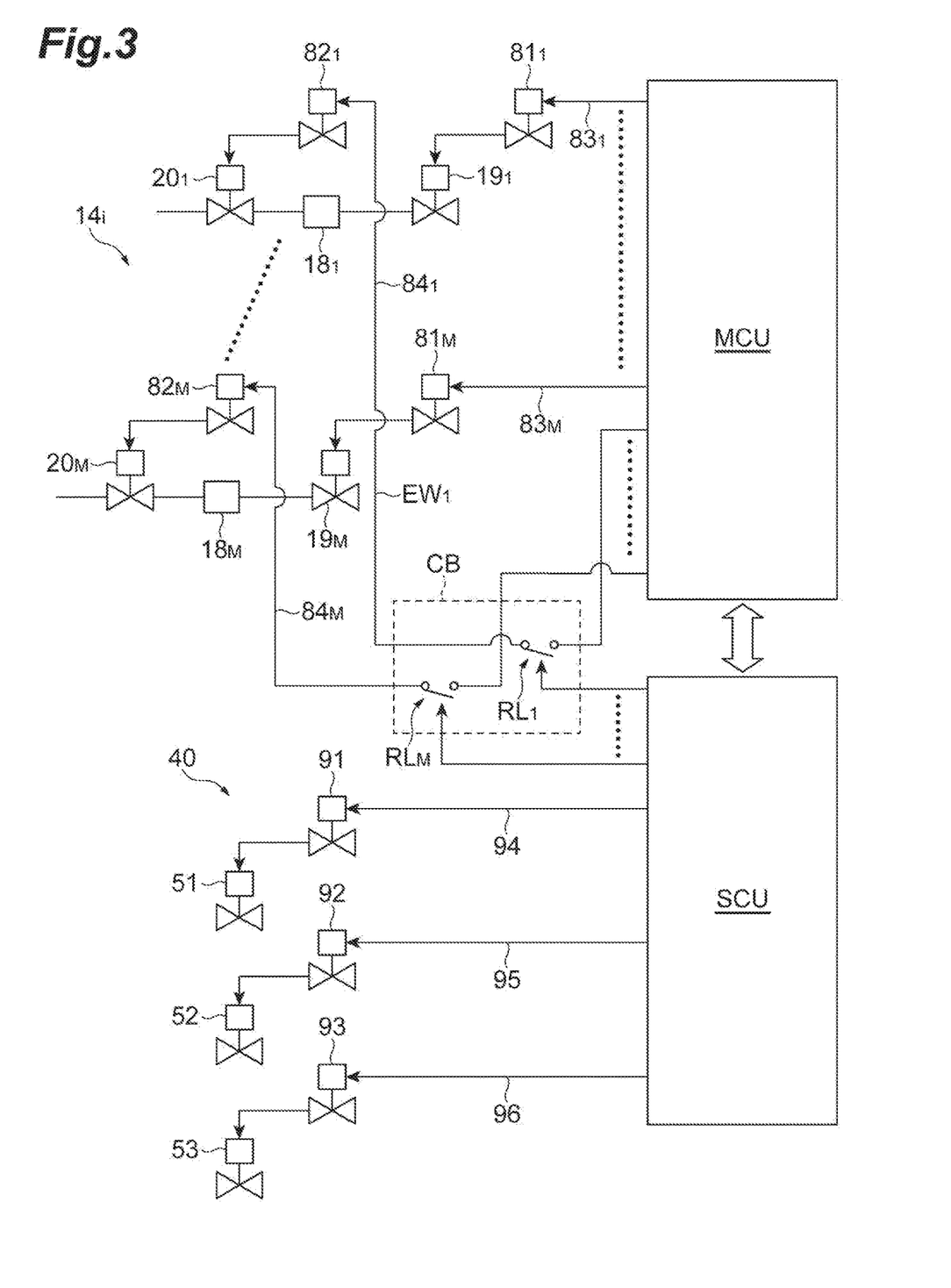
FIG. 3 illustrates a first controller, a plurality of gas supply units, and a measurement apparatus of the substrate processing system according to an exemplary embodiment.

FIG. 3 illustrates a first controller, a plurality of gas supply units, and a measurement apparatus of the substrate processing system according to an exemplary embodiment.

Hereinafter, FIG. 3 is referred together with FIG. 1. The measurement apparatus 40 is configured to measure a flow rate of a gas output by each of the plurality of flow rate controllers 18. The measurement apparatus 40 is provided with a controller (second controller), a gas flow channel, and various sensors which are used in the measurement of a flow rate of a gas according to a build-up method. Specifically, the measurement apparatus 40 includes a second gas flow channel 42, a third gas flow channel 43, a pressure sensor 47, a pressure sensor 48, a temperature sensor 49, a first valve 51, a second valve 52, and a second controller SCU.

The second gas flow channel 42 includes a plurality of fourth ends 42a and a fifth end 42b, and extends from the plurality of fourth ends 42a to the fifth end 42b. In a case where the number of each of the substrate processing apparatuses 11 and the gas supply units 14 in the substrate processing system 10 is one, the number of the fourth ends 42a may be one. Each of the plurality of fourth ends 42a is connected to the second end 21b of the first gas flow channel 21 of the corresponding gas supply unit among the plurality of gas supply units 14. In an embodiment, each of the plurality of fourth ends 42a is connected to the valve 22 of the corresponding gas supply unit among the plurality of gas supply units 14. The second gas flow channel 42 includes a plurality of flow channels including the plurality of fourth ends 42a, respectively, and a common flow channel to which the plurality of flow channels are connected. The common flow channel of the second gas flow channel 42 includes the fifth end 42b.

The third gas flow channel 43 includes a sixth end 43a and a seventh end 43b, and extends from the sixth end 43a to the seventh end 43b. The first valve 51 is connected between the fifth end 42b of the second gas flow channel 42 and the sixth end 43a of the third gas flow channel 43. The second valve 52 is connected to the seventh end 43b of the third gas flow channel 43, and is provided so as to be capable of being connected to the plurality of exhaust apparatuses 16.

Each of the pressure sensor 47 and the pressure sensor 48 is configured to measure a pressure within the third gas flow channel 43. The temperature sensor 49 (first temperature sensor) is configured to measure a temperature within the third gas flow channel 43. It should be noted that the measurement apparatus 40 may have at least one of the pressure sensor 47 and the pressure sensor 48. That is, the measurement apparatus 40 may have one or more pressure sensors that measure a pressure within the third gas flow channel 43.

In an embodiment, the measurement apparatus 40 may further include a fourth gas flow channel 44, a third valve 53, and a fourth valve 54. The fourth gas flow channel 44 has an eighth end 44a, a ninth end 44b, and a tenth end 44c. In addition, the fourth gas flow channel 44 has a first partial flow channel 44d and a second partial flow channel 44e. The first partial flow channel 44d extends between the eighth end 44a and the ninth end 44b. The second partial flow channel 44e is branched from the first partial flow channel 44d to extend to the tenth end 44c. The above-described second valve 52 is connected between the seventh end 43b of the third gas flow channel 43 and the eighth end 44a of the fourth gas flow channel 44. The third valve 53 is connected between the ninth end 44b of the fourth gas flow channel 44 and each of the plurality of exhaust apparatuses 16. In an embodiment, N valves 58 are connected to the plurality of exhaust flow channels 36, respectively. The third valve 53 is connected to the exhaust apparatus $16_i$ through the valve $58_i$ and the exhaust flow channel $36_i$. The fourth valve 54 is provided on the second partial flow channel 44e.

The second controller SCU may be a computer device including a processor such as a CPU, a storage device such as a memory. The second controller SCU executes the control program stored in the storage device by the processor. When receiving an instruction to measure the flow rate of the gas from the first controller MCU, the second controller SCU performs control and executes an arithmetic operation for measuring the flow rate of the gas. The second controller SCU controls the first valve 51, the second valve 52, the third valve 53, and the fourth valve 54. In addition, the second controller SCU controls a plurality of relays described later. Further, the second controller SCU performs an arithmetic operation for calculating the flow rate of the gas using the measured values acquired from each of the pressure sensor 47, the pressure sensor 48, and the temperature sensor 49. The second controller SCU transmits a request to the first controller MCU in order to control elements controlled by the first controller MCU.

In a method MT to be described later, a reference device 60 and a reference pressure sensor 70 are used. The reference device 60 includes a tank 62, a pressure sensor 63, a temperature sensor 64, and a valve 65. The tank 62 provides an internal space. The pressure sensor 63 is configured to measure a pressure in the internal space of the tank 62. The temperature sensor 64 is configured to measure a temperature in the internal space of the tank 62. The valve 65 is connected to the tank 62. The valve 65 is connected between the fourth valve 54 and the internal space of the tank 62 when the reference device 60 is connected to the tenth end 44c of the fourth gas flow channel 44.

The reference pressure sensor 70 can be connected to the tank 62. In an embodiment, the reference device 60 may further include a valve 66. The reference pressure sensor 70 may be connected to the internal space of the tank 62 through the valve 66. The reference pressure sensor 70 is configured to measure a pressure in the internal space of the tank 62 when the reference pressure sensor is connected to the internal space of the tank 62.

As described above, the first controller MCU is configured to control opening and closing of each of the plurality of primary valves 19 and the plurality of secondary valves 20. As shown in FIG. 3, the substrate processing system 10 further includes a plurality of wirings 83. The number of the plurality of wirings 83 is equal to the number of the primary valves 19 in the substrate processing system 10. That is, the number of the plurality of wirings 83 is N×M+2. The plurality of the wirings 83 are connected to the first controller MCU. The first controller MCU is configured to output a voltage through a plurality of wirings 83 to open the plurality of primary valves 19 of the plurality of gas supply units 14.

In an embodiment, each of the plurality of gas supply units 14 further includes a plurality of solenoid valves 81. The number of the plurality of solenoid valves 81 of the gas supply unit $14_i$ is equal to the number of the primary valves 19 of the gas supply unit $14_i$. Each of the plurality of solenoid valves 81 of the plurality of gas supply units 14 is connected to the first controller MCU through the corresponding wiring among the plurality of wirings 83, respectively. Each of the plurality of solenoid valves 81 outputs air when a voltage is applied to a solenoid thereof from the first controller MCU through the corresponding wiring 83. On the other hand, each of the plurality of solenoid valves 81 stops the output of air when the voltage is not applied to a solenoid thereof from the first controller MCU. Each of the plurality of primary valves 19 is opened when the air is supplied from the corresponding solenoid valve among the plurality of solenoid valves 81. Each of the plurality of primary valves 19 is closed when no air is supplied from the corresponding solenoid valve among the plurality of solenoid valves 81.

The substrate processing system 10 further includes a plurality of wirings 84. The number of the plurality of wirings 84 is equal to the number of the secondary valves 20 in the substrate processing system 10. The plurality of the wirings 84 is connected to the first controller MCU. The first controller MCU is configured to output a voltage through the plurality of wirings 84 to open a plurality of secondary valves 20 of the plurality of gas supply units 14.

In an embodiment, each of the plurality of gas supply units 14 further includes a plurality of solenoid valves 82. The number of the plurality of solenoid valves 82 of the gas supply unit $14_i$ is equal to the number of the secondary valves 20 of the gas supply unit $14_i$. Each of the plurality of solenoid valves 82 of the plurality of gas supply units 14 is connected to the first controller MCU through the corresponding wiring of the plurality of wirings 84, respectively. Each of the plurality of solenoid valves 82 outputs air when a voltage is applied to a solenoid thereof from the first controller MCU through the corresponding wiring 84. On the other hand, each of the plurality of solenoid valves 82 stops the output of air when the voltage is not applied to a solenoid thereof from the first controller MCU. Each of the plurality of secondary valves 20 is opened when the air is supplied from the corresponding solenoid valve among the plurality of solenoid valves 82. Each of the plurality of secondary valves 20 is closed when no air is supplied from the corresponding solenoid valve among the plurality of solenoid valves 82.

It should be noted that opening and closing of each of the plurality of valves 22, the plurality of on/off valves 30, the plurality of valves 38, and the plurality of valves 58 may also be controlled by the air from the corresponding solenoid valve, as is the case with the opening and closing of each of the plurality of primary valves 19. The output of the air from the solenoid valve corresponding to each of the plurality of valves 22, the plurality of on/off valves 30, the plurality of valves 38, and the plurality of valves 58 and the stop of the output thereof are controlled by the voltage output from the first controller MCU through the corresponding wiring.

The measurement apparatus 40 further includes a plurality of wirings 94 to 96. The plurality of wirings 94 to 96 are connected to the second controller SCU. The second controller SCU is configured to output a voltage through the wiring 94 to open the first valve 51 and output a voltage through the wiring 95 to open the second valve 52, and output a voltage through the wiring 96 to open the third valve 53.

In an embodiment, the measurement apparatus 40 further includes a plurality of solenoid valves 91 to 93. Each of the plurality of solenoid valves 91 to 93 is connected to the second controller SCU through a plurality of wirings 94 to 96. Each of the plurality of solenoid valves 91 to 93 outputs air when a voltage is applied to the solenoid through the corresponding wiring among the plurality of wirings 94 to 96. On the other hand, each of the plurality of solenoid valves 91 to 93 stops the output of air when a voltage is not applied to a solenoid thereof from the second controller SCU. The plurality of solenoid valves 91 to 93 are connected to the first to third valves 51 to 53, respectively. Each of the first to third valves 51 to 53 is opened when the air is supplied from the corresponding solenoid valve among the plurality of solenoid valves 91 to 93. Each of the first to third valves 51 to 53 is closed when no air is supplied from the corresponding solenoid valve among the plurality of solenoid valves 91 to 93.

The opening and closing of the fourth valve 54 may be controlled by air from the corresponding solenoid valve, as is the case with the opening and closing of each of the first to third valves 51 to 53. The output of the air from the solenoid valve corresponding to the fourth valve 54 and the stop of the output thereof are controlled by a voltage output from the second controller SCU through the corresponding wiring.

The measurement apparatus 40 further includes a plurality of relays RL. The number of relays RL is the same as the number of the wirings 84. The plurality of relays RL is provided on the plurality of wirings 84, respectively. The plurality of relays RL may be provided on the plurality of wirings 84 in a circuit board CB of the measurement apparatus 40. The plurality of relays RL are controlled by the second controller SCU. When each of the plurality of relays RL is controlled by the second controller SCU to disconnect the corresponding wiring 84, a voltage output from the first controller MCU is not applied to the solenoid valve 82 corresponding to the secondary valve 20, even though the voltage is output from the first controller MCU to open the corresponding secondary valve 20. Therefore, the air is not supplied from the solenoid valve 82 corresponding to the secondary valve 20, and as a result, the secondary valve 20 is closed without control from the first controller MCU.

In the substrate processing system 10, in a case of measuring a flow rate in a state where a gas is supplied from a flow rate controller $18_j$ to the first gas flow channel 21, the second gas flow channel 42, and the third gas flow channel 43, the second controller SCU controls the second valve 52 directly to close the second valve 52. When the second valve 52 is closed, the pressure in the third gas flow channel rises. In order to determine the rate of rise in pressure, it is necessary that a secondary valve $20_j$ connected to the secondary side of the flow rate controller $18_j$ is then closed. The secondary valve $20_j$ is opened by the voltage output from the first controller MCU, and is closed when the output of the voltage is stopped. That is, the secondary valve $20_j$ is a valve controlled by the first controller MCU. Therefore, by transmitting a request to close the secondary valve $20_j$ from the second controller SCU to the first controller MCU by communication, the secondary valve $20_j$ can be closed. However, in a case where the time when the secondary valve $20_j$ is closed by the first controller MCU is delayed from the time when the second controller SCU transmits the request, the second controller SCU cannot accurately obtain the time length of the period during which the pressure within the third gas flow channel 43 rises. In the substrate processing system 10, a relay $RL_j$ is provided on a wiring $84_j$, and the relay $RL_j$ is controlled by the second controller SCU. Therefore, the secondary valve $20_j$ can be instantaneously closed by control of the second controller SCU without the first controller MCU. That is, it is possible to suppress delay of control for closing the secondary valve $20_j$. Further, according to the substrate processing system 10, the time length of the period during which the pressure within the third gas flow channel 43 rises can be accurately specified, and the flow rate of the gas is accurately determined based on the time length.

Figure 4:
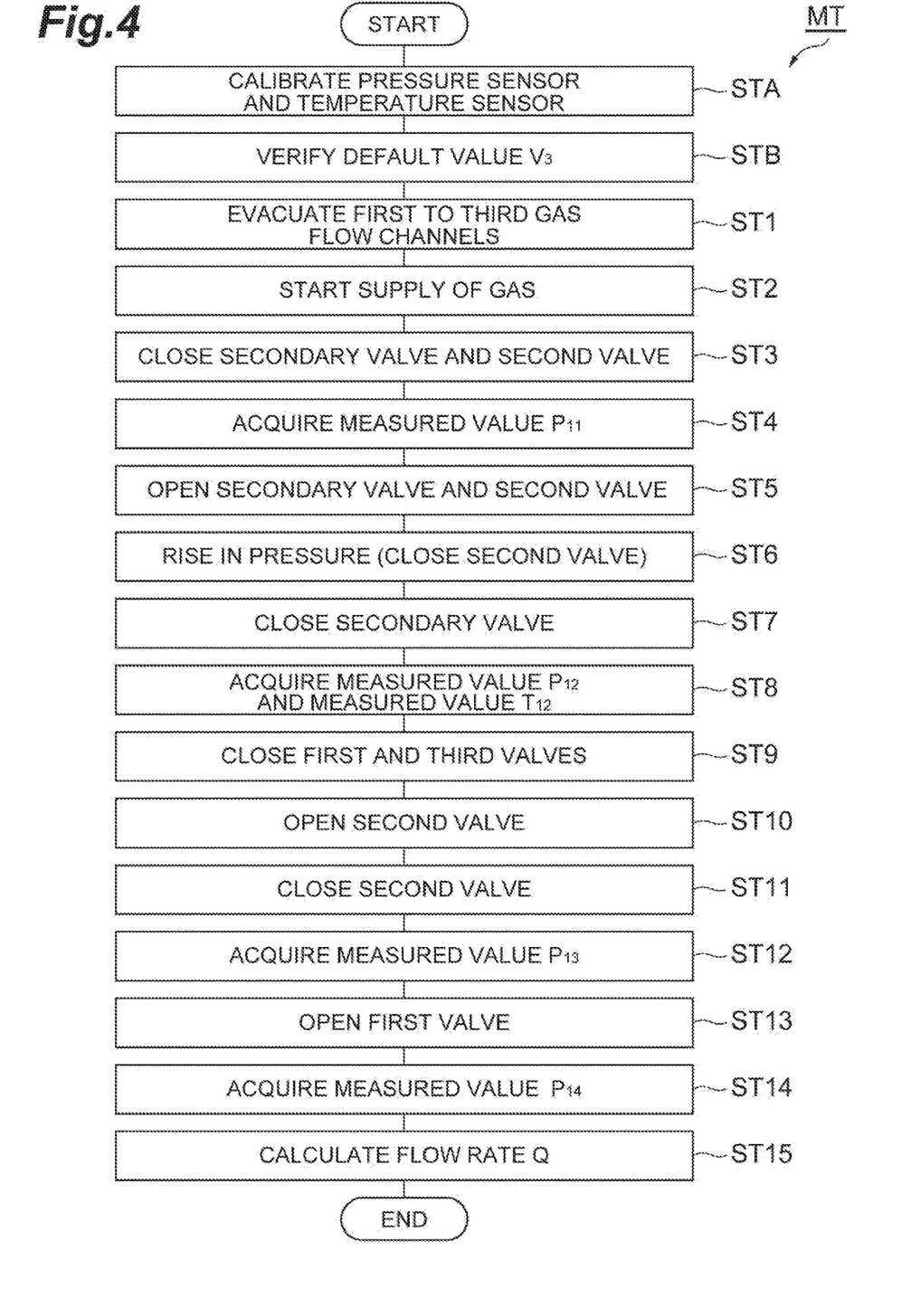
FIG. 4 is a flow diagram illustrating a method of determining a flow rate of a gas according to an exemplary embodiment.

Hereinafter, with reference to FIG. 4, a method of determining a flow rate of a gas according to an embodiment will be described. FIG. 4 is a flow diagram illustrating a method of determining a flow rate of a gas according to an exemplary embodiment. A method MT shown in FIG. 4 is executed using a measurement apparatus in order to determine a flow rate of a gas in a substrate processing system.

In the following description, the method MT will be described using a case where a flow rate of a gas output from one flow rate controller $18_j$ of one gas supply unit $14_i$ is measured as an example. During the execution of the method MT, the valves 22 of the plurality of gas supply units 14 other than the gas supply unit $14_i$ are closed. In addition, valves other than one valve among the plurality of valves 58 are closed. In the following description, it is assumed that valves other than the valve $58_i$ among the plurality of valves 58 are closed. Further, the plurality of primary valves 19 and the plurality of secondary valves 20 which are connected to the plurality of flow rate controllers 18 other than the flow rate controller $18_j$ of one gas supply unit $14_i$ may be opened or closed.

An arithmetic operation in the method MT is executed by the second controller SCU. Unless otherwise mentioned, in the method MT, the plurality of valves of the measurement apparatus 40 are controlled by the second controller SCU, and other valves of the substrate processing system 10 are controlled by the first controller MCU in response to a request from the second controller SCU. In the method MT, designation of the set flow rate for the flow rate controller $18_j$ is executed by the first controller MCU. Steps ST1 to ST15 are executed by the second controller SCU which has received an instruction to measure the flow rate from the first controller MCU.

The method MT includes steps ST1 to ST15. In an embodiment, the method MT may further include step STA in addition to steps ST1 to ST15. In an embodiment, the method MT may further include step STB.

Figure 5:
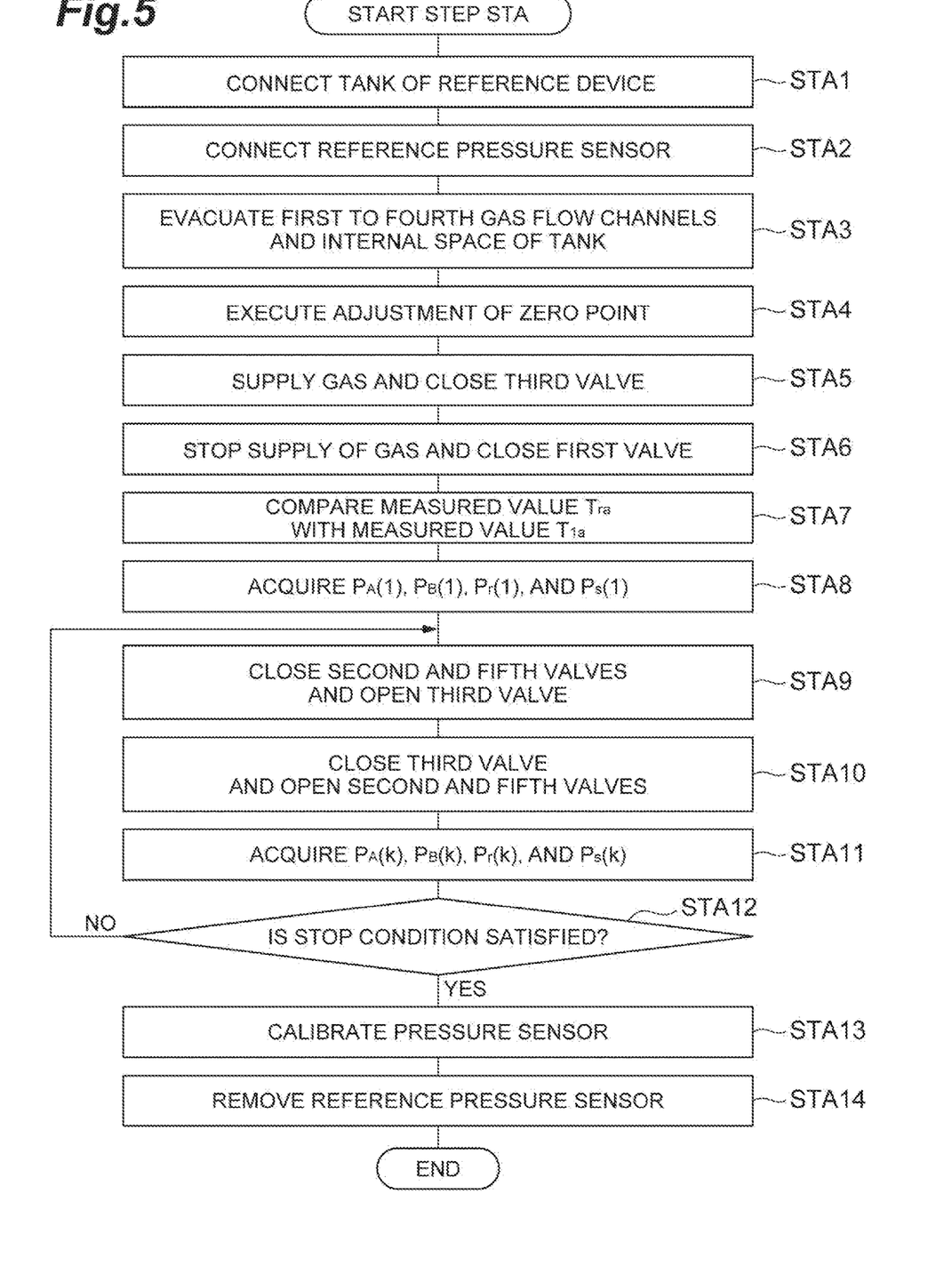
FIG. 5 is a flow diagram illustrating the detail of an example of step STA of the method shown in FIG. 4.

In step STA, calibration of the pressure sensor 47, the pressure sensor 48, the pressure sensor 63, the temperature sensor 49, and the temperature sensor 64 is performed. FIG. 5 is a flow diagram illustrating the detail of an example of step STA of the method illustrated in FIG. 4. As shown in FIG. 5, step STA includes steps STA1 to STA4.

In step STA1, the tank 62 of the reference device 60 is connected to the tenth end 44c of the fourth gas flow channel 44. Specifically, the valve 65 of the reference device 60 is connected to the tenth end 44c of the fourth gas flow channel 44. In the subsequent step STA2, the reference pressure sensor 70 is connected to the internal space of the tank 62 of the reference device 60. Specifically, the reference pressure sensor 70 is connected to the valve 66.

In the subsequent step STA3, the first gas flow channel 21, the second gas flow channel 42, the third gas flow channel 43, the fourth gas flow channel 44, and the internal space of the tank 62 are evacuated. In step STA3, a primary valve $19_j$ connected to the flow rate controller $18_j$ of the gas supply unit $14_i$ is closed, and the secondary valve $20_j$ connected to the flow rate controller $18_j$ of the gas supply unit $14_i$ is opened. Further, in step STA3, the valve 22 of the gas supply unit $14_i$, the first valve 51, the second valve 52, the third valve 53, the fourth valve 54, the valve 65, the valve 66, and the valve $58_i$ are opened. As a result, in step STA3, the first gas flow channel 21, the second gas flow channel 42, the third gas flow channel 43, the fourth gas flow channel 44, and the internal space of the tank 62 are connected to the exhaust apparatus $16_i$ and evacuated.

In the subsequent step STA4, a zero point of a measured value of each of the pressure sensor 47, the pressure sensor 48, and the pressure sensor 63 is adjusted in a state where the first gas flow channel 21, the second gas flow channel 42, the third gas flow channel 43, the fourth gas flow channel 44, and the internal space of the tank 62 are evacuated. That is, in step STA4, each of the pressure sensor 47, the pressure sensor 48, and the pressure sensor 63 is calibrated so that the measured value thereof indicates zero.

In the subsequent step STA5, the primary valve $19_j$ connected to the flow rate controller $18_j$ of the gas supply unit $14_i$ is opened, and the third valve 53 is closed in a state where a gas is output from the flow rate controller $18_j$. In the subsequent step STA6, the supply of a gas from the flow rate controller $18_j$ of the gas supply unit $14_i$ is stopped, and the first valve 51 is closed. A standby state continues until a measured value of the reference pressure sensor 70 is stabilized and a measured value of the temperature sensor 64 is stabilized. It is determined that the measured value of the reference pressure sensor 70 is stabilized in a case where the amount of fluctuation thereof is equal to or less than a predetermined value. In addition, it is determined that the measured value of the temperature sensor 64 is stabilized in a case where the amount of fluctuation thereof is equal to or less than a predetermined value.

In step STA6, when the measured value of the reference pressure sensor 70 is stabilized and the measured value of the temperature sensor 64 is stabilized, a state where a gas is confined in the third gas flow channel 43, the fourth gas flow channel 44, and the internal space of the tank 62 which communicate with each other so that a pressure in the third gas flow channel 43, a pressure in the fourth gas flow channel 44, and a pressure in the internal space of the tank 62 are set to be the same pressure is formed. In such a state, the subsequent step STA7 is executed. In step STA7, a measured value $T_{ra}$ of the temperature sensor 64 and a measured value $T_{1a}$ of the temperature sensor 49 are acquired, and the measured value $T_{ra}$ and the measured value $T_{1a}$ are compared with each other. Specifically, it is determined whether or not an absolute value of a difference between the measured value $T_{ra}$ and the measured value $T_{1a}$ falls within a predetermined allowable range. For example, it is determined whether or not a relation of $|T_{1a}-T_{ra}|<T_{THa}$ is satisfied. Here, $T_{THa}$ is a numerical value which defines the predetermined allowable range. In a case where the absolute value of the difference between the measured value $T_{ra}$ and the measured value $T_{1a}$ does not fall within the predetermined allowable range, the temperature sensor 49 is calibrated or replaced.

In the subsequent step STA8, a measured value group is acquired in the above-described state formed in step STA6. The measured value group acquired in step STA8 includes a measured value $P_A(1)$ of the pressure sensor 47, a measured value $P_B(1)$ of the pressure sensor 48, a measured value $P_r(1)$ of the pressure sensor 63, and a measured value $P_S(1)$ of the reference pressure sensor 70.

In the subsequent step STA9, the second valve 52 and the valve 65 are closed, and the third valve 53 is opened. A gas in the fourth gas flow channel 44 is at least partially discharged by the execution of step STA9. In the subsequent step STA10, the third valve 53 is closed, and the second valve 52 and the valve 65 are opened. Gases in the third gas flow channel 43 and the internal space of the tank 62 diffuse in the third gas flow channel 43, the fourth gas flow channel 44, and the internal space of the tank 62 by the execution of step STA10. A standby state continues until the measured value of the reference pressure sensor 70 is stabilized. It is determined that the measured value of the reference pressure sensor 70 is stabilized in a case where the amount of fluctuation thereof is equal to or less than a predetermined value.

In a case where it is determined in step STA10 that the measured value of the reference pressure sensor 70 is stabilized, a state where a gas is confined in the third gas flow channel 43, the fourth gas flow channel 44, and the internal space of the tank 62 which communicate with each other so that a pressure in the third gas flow channel 43, a pressure in the fourth gas flow channel 44, and a pressure in the internal space of the tank 62 are set to be the same pressure is formed. In such a state, the subsequent step STA11 is executed. In step STA11, a measured value group is acquired. The measured value group acquired in step STA11 includes a measured value $P_A(k)$ of the pressure sensor 47, a measured value $P_B(k)$ of the pressure sensor 48, a measured value $P_r(k)$ of the pressure sensor 63, and a measured value $P_S(k)$ of the reference pressure sensor 70. Here, k denotes a numerical value indicating the order of a cycle to be described later, and is an integer equal to or greater than 1.

In the subsequent step STA12, it is determined whether or not a stop condition is satisfied. It is determined in step STA12 that the stop condition is satisfied in a case where the number of times of the execution of a cycle including steps STA9 to STA11 reaches a predetermined number of times. In a case where it is determined in step STA12 that the stop condition is not satisfied, steps STA9 to STA11 are executed again. On the other hand, in a case where it is determined in step STA12 that the stop condition is satisfied, the process proceeds to step STA13.

In step STA, step STA8 and the repetition of step STA11 are executed as described above. A step of acquiring a measured value group is executed in each of a plurality of cycles by step STA8 and the repetition of step STA11. As a result, a plurality of measured value groups are acquired. In a k-th cycle among the plurality of cycles, a gas confined in the fourth gas flow channel 44 in a (k−1)-th cycle among the plurality of cycles is discharged, and gases confined in the third gas flow channel 43 and the internal space of the tank 62 in the (k−1)-th cycle are diffused to the fourth gas flow channel 44, so that a state where a gas is confined in the third gas flow channel 43, the fourth gas flow channel 44, and the internal space of the tank 62 is formed.

In step STA13, a pressure sensor identified from each of the plurality of measured value groups as a sensor among the pressure sensor 47, the pressure sensor 48, and the pressure sensor 63 which has acquired a measured value having an error that does not fall within a predetermined allowable range from the measured value of the reference pressure sensor 70 is calibrated. For example, in a case where a relation of $|P_A(k)-P_S(k)|<P_{TH}$ is not satisfied, it is determined that the measured value of the pressure sensor 47 has an error that does not fall within the predetermined allowable range from the measured value of the reference pressure sensor 70, and the pressure sensor 47 is calibrated. Further, in a case where a relation of $|P_B(k)-P_S(k)|<P_{TH}$ is not satisfied, it is determined that the measured value of the pressure sensor 48 has an error that does not fall within the predetermined allowable range from the measured value of the reference pressure sensor 70, and the pressure sensor 48 is calibrated. Further, in a case where a relation of $|P_r(k)-P_S(k)|<P_{TH}$ is not satisfied, it is determined that the measured value of the pressure sensor 63 has an error that does not fall within the predetermined allowable range from the measured value of the reference pressure sensor 70, and the pressure sensor 63 is calibrated. $P_{TH}$ is a numerical value which defines the predetermined allowable range.

In the subsequent step STA14, the reference pressure sensor 70 is removed. Specifically, the valve 66 is closed, and the reference pressure sensor 70 is removed from the valve 66.

According to such step STA, the pressure sensor 47, the pressure sensor 48, and the pressure sensor 63 are appropriately calibrated. As a result, the accuracy of calculation of a flow rate Q to be described later is improved.

Figure 6:
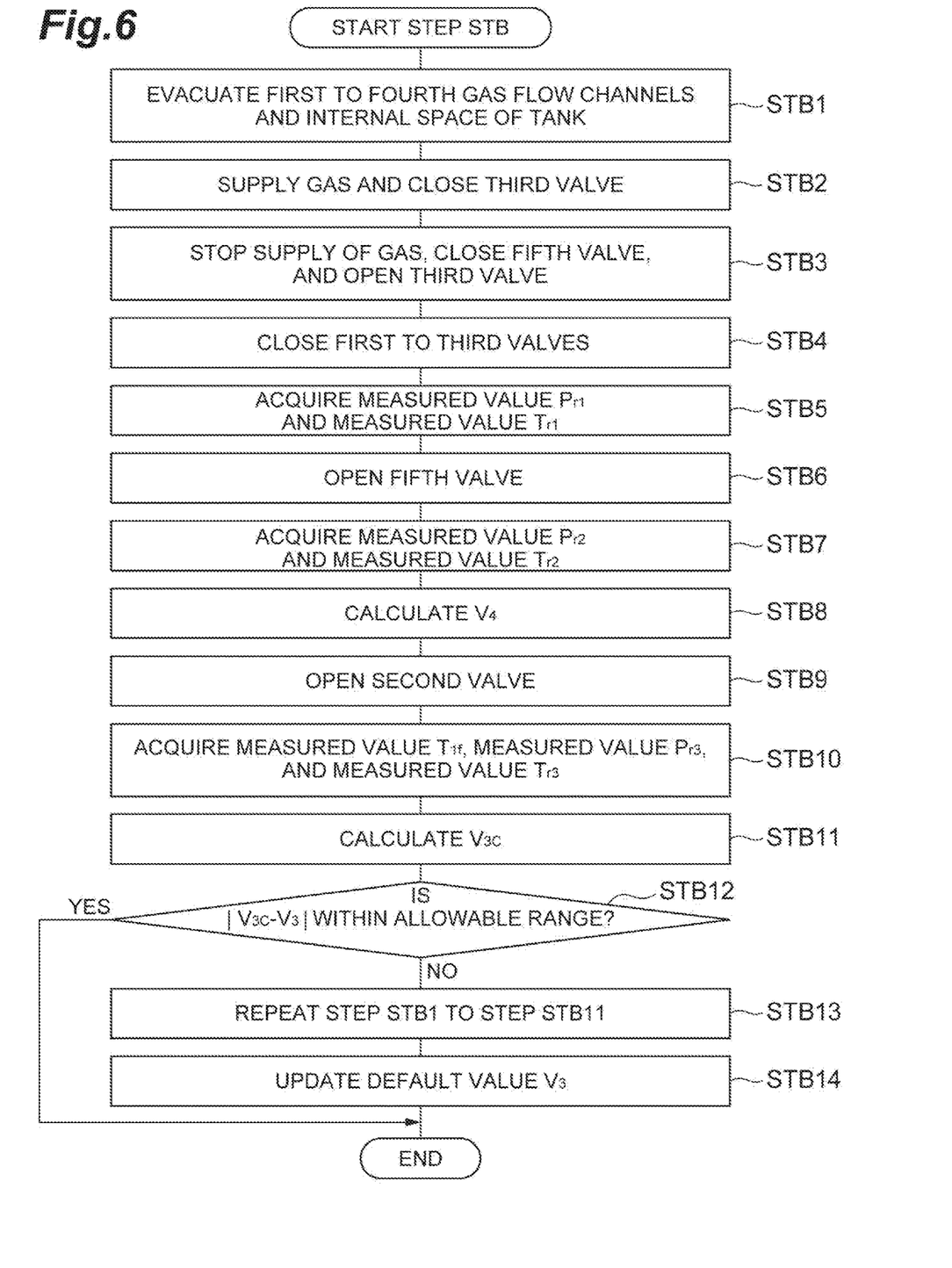
FIG. 6 is a flow diagram illustrating the detail of an example of step STB of the method shown in FIG. 4.

As described above, in an embodiment, the method MT further includes step STB. In an embodiment, step STB is executed after step STA is executed. In step STB, the reliability of a default value $V_3$ is verified. The default value $V_3$ is the volume of the third gas flow channel 43, and is set in advance. FIG. 6 is a flow diagram illustrating the detail of an example of step STB of the method shown in FIG. 4. As shown in FIG. 6, step STB includes steps STB1 to STB14.

In step STB1, the first gas flow channel 21, the second gas flow channel 42, the third gas flow channel 43, the fourth gas flow channel 44, and the internal space of the tank 62 are evacuated. In step STB1, the primary valve 19$_j$ connected to the flow rate controller 18$_j$ of the gas supply unit 14$_i$ is closed, and the secondary valve 20$_j$ connected to the flow rate controller 18$_j$ of the gas supply unit 14$_i$ is opened. Further, in step STB1, the valve 22 of the gas supply unit 14$_i$, the first valve 51, the second valve 52, the third valve 53, the fourth valve 54, the valve 65, and the valve 58$_i$ are opened, and the valve 66 is closed. As a result, in step STB1, the first gas flow channel 21, the second gas flow channel 42, the third gas flow channel 43, the fourth gas flow channel 44, and the internal space of the tank 62 are connected to the exhaust apparatus 16$_i$ and evacuated.

In the subsequent step STB2, the primary valve 19$_j$ connected to the flow rate controller 18$_j$ of the gas supply unit 14$_i$ is opened, and the third valve 53 is closed in a state where a gas is output from the flow rate controller 18$_j$. A gas is confined in the first gas flow channel 21, the second gas flow channel 42, the third gas flow channel 43, the fourth gas flow channel 44, and the internal space of the tank 62 by the execution of step STB2.

In the subsequent step STB3, the supply of a gas from the flow rate controller 18$_j$ of the gas supply unit 14$_i$ is stopped, the valve 65 is closed, and the third valve 53 is opened. A state where a gas is confined in the internal space of the tank 62 is formed by the execution of step STB3. In addition, gases confined in the third gas flow channel 43 and the fourth gas flow channel 44 are discharged by the execution of step STB3.

In the subsequent step STB4, the first valve 51, the second valve 52, and the third valve 53 are closed. The fourth valve 54 remains open. In the subsequent step STB5, a measured value $P_{r1}$ of a pressure in the internal space of the tank 62 and a measured value $T_{r1}$ of temperature in the internal space of the tank 62 are acquired using the pressure sensor 63 and the temperature sensor 64 in a state where a gas is confined in the internal space of the tank 62.

In the subsequent step STB6, the valve 65 is opened. A standby state continues until a measured value of the pressure sensor 63 is stabilized. It is determined that the measured value of the pressure sensor 63 is stabilized in a case where the amount of fluctuation thereof is equal to or less than a predetermined value. In step STB6, when the measured value of the pressure sensor 63 is stabilized, a state where a gas confined in the internal space of the tank 62 is diffused in the internal space of the tank 62 and the fourth gas flow channel 44 is formed. In the subsequent step STB7, a measured value $P_{r2}$ of a pressure in the internal space of the tank 62 and a measured value $T_{r2}$ of temperature in the internal space of the tank 62 are acquired using the pressure sensor 63 and the temperature sensor 64, respectively, in the state formed in step STB6.

In the subsequent step STB8, a calculated value $V_4$ of the volume of the fourth gas flow channel 44 is determined. In step STB8, an arithmetic operation of the following Expression (2) is executed in order to determine the calculated value $V_4$. In the arithmetic operation of Expression (2), an already-known volume $V_r$ of the internal space of the tank 62, the measured value $P_{r1}$, the measured value $T_{r1}$, the measured value $P_{r2}$, and the measured value $T_{r2}$ are used.

$$V_4 = V_r \times (P_{r1}/T_{r1} - P_{r2}/T_{r2}) \times T_{r2}/P_{r2} \tag{2}$$

In the subsequent step STB9, the second valve 52 is opened. A standby state continues until the measured value of the pressure sensor 63 is stabilized. It is determined that the measured value of the pressure sensor 63 is stabilized in a case where the amount of fluctuation there is equal to or less than a predetermined value. In step STB9, when the measured value of the pressure sensor 63 is stabilized, a state where gases diffused in the internal space of the tank 62 and the fourth gas flow channel 44 are diffused in the internal space of the tank 62, the third gas flow channel 43, and the fourth gas flow channel 44 is formed. In the subsequent step STB10, a measured value $T_{1f}$ of temperature in the third gas flow channel 43, a measured value $P_{r3}$ of a pressure in the internal space of the tank 62, and a measured value $T_{r3}$ of temperature in the internal space of the tank 62 are acquired using the temperature sensor 49, the pressure sensor 63, and the temperature sensor 64, respectively, in the state formed in step STB9.

In the subsequent step STB11, a calculated value $V_{3C}$ of the volume of the third gas flow channel 43 is determined. In step STB11, an arithmetic operation of the following Expression (3) is executed in order to determine the calculated value $V_{3C}$. In the arithmetic operation of Expression (3), the already-known volume $V_r$ of the internal space of the tank 62, the measured value $P_{r1}$, the measured value $T_{r1}$, the calculated value $V_4$, the measured value $P_{r3}$, the measured value $T_{r3}$, and the measured value $T_{1f}$ are used.

$$V_{3C} = (V_r \times P_{r1}/T_{r1} - V_4 \times P_{r3}/T_{r3} - V_r \times P_{r3}/T_{r3}) \times T_{1f}/P_{r3} \tag{3}$$

In the subsequent step STB12, it is determined whether or not an absolute value of a difference between the calculated value $V_{3C}$ and the default value $V_3$ falls within a predetermined allowable range. For example, it is determined whether or not a relation of $|V_{3C} - V_3| < V_{TH}$ is satisfied. In a case where the relation of $|V_{3C} - V_3| < V_{TH}$ is not satisfied, it is determined that the absolute value of the difference between the calculated value $V_{3C}$ and the default value $V_3$ does not fall within the predetermined allowable range. $V_{TH}$ is a numerical value which defines the predetermined allowable range. On the other hand, in a case where the relation of $|V_{3C} - V_3| < V_{TH}$ is satisfied, it is determined that the absolute value of the difference between the calculated value $V_{3C}$ and the default value $V_3$ falls within the predetermined allowable range.

In a case where it is determined in step STB12 that the absolute value of the difference between the calculated value $V_{3C}$ and the default value $V_3$ does not fall within the predetermined allowable range, step STB13 is executed. In step STB13, steps STB1 to STB11 are repeatedly executed. As a result, a plurality of calculated values $V_{3C}$ are acquired. In the subsequent step STB4, the default value $V_3$ is updated using an average value of the plurality of calculated values $V_{3C}$. That is, the default value $V_3$ is replaced with the average value of the plurality of calculated values $V_{3C}$.

After the execution of step STB14 or in a case where it is determined in step STB12 that the absolute value of the difference between the calculated value $V_{3C}$ and the default value $V_3$ falls within the predetermined allowable range, the execution of step STB is terminated. The fourth valve 54 and the valve 65 may be closed before step STB is terminated, and then the reference device 60 may be removed from the tenth end 44c.

In such step STB, the calculated value $V_{3C}$ of the volume of the third gas flow channel 43 is acquired on the basis of the Boyle-Charles' law. The calculated value $V_{3C}$ and the default value $V_3$ are compared with each other, and thus the reliability of the default value $V_3$ is verified. Further, in step STB, the default value $V_3$ is updated using the average value of the plurality of calculated values $V_{3C}$, and thus the default value $V_3$ with high reliability is obtained. Accordingly, the accuracy of calculation of the flow rate Q to be described later is improved.

Figure 7:
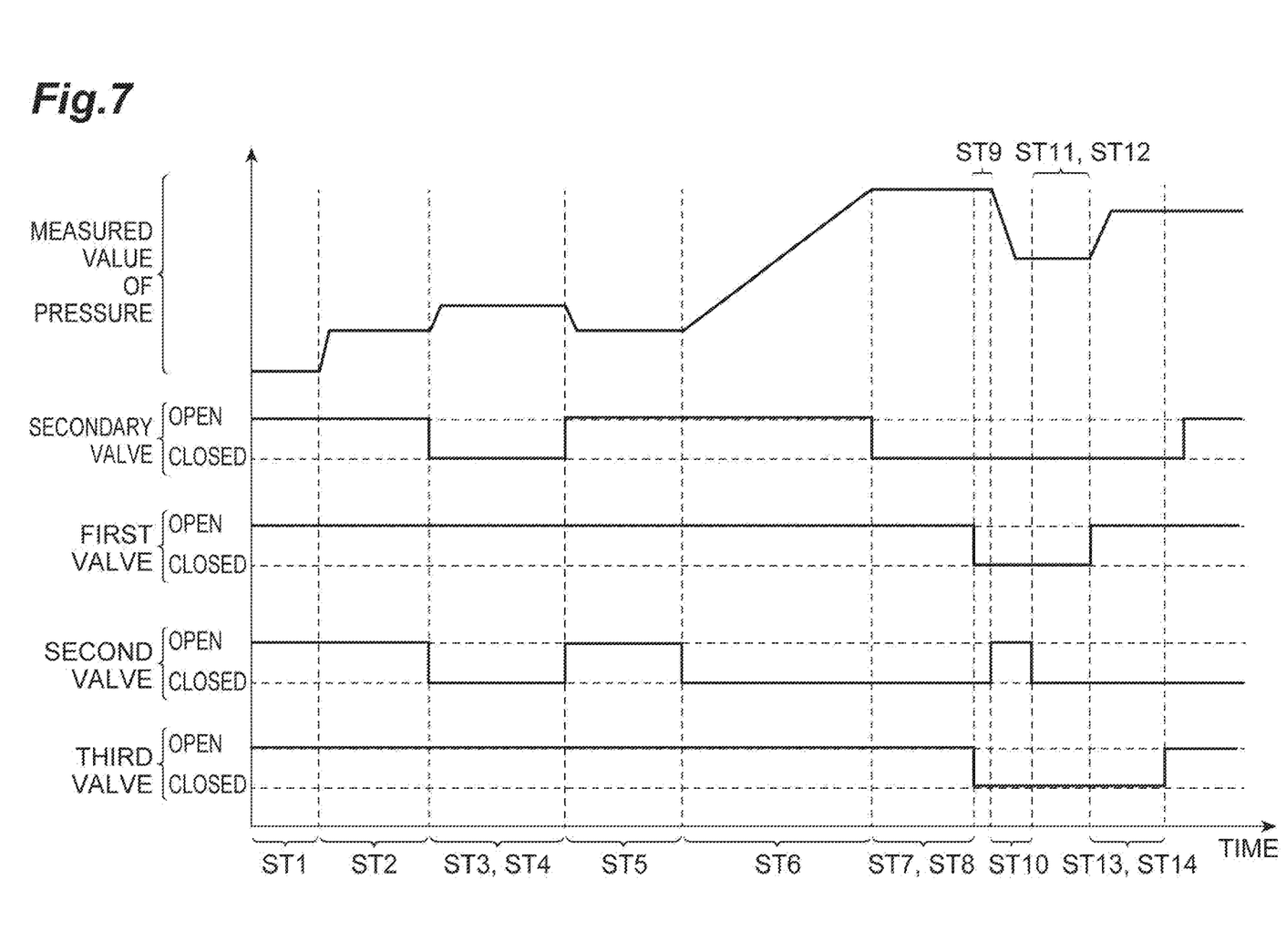
FIG. 7 is an example of a timing diagram relating to the method shown in FIG. 4.

FIG. 4 will be referred to again. Further, in the following description, FIG. 7 will be referred to together with FIG. 4. FIG. 7 is an example of a timing diagram relating to the method illustrated in FIG. 4. In the timing diagram of FIG. 7, the horizontal axis represents a time. In the timing diagram of FIG. 7, the vertical axis represents a measured value of the pressure of the third gas flow channel 43, an open/close state of the secondary valve $20_i$ connected to the flow rate controller $18_j$ of the gas supply unit $14_i$, an open/close state of the first valve 51, an open/close state of the second valve 52, and an open/close state of the third valve 53.

In step ST1 of the method MT, the first gas flow channel 21, the second gas flow channel 42, and the third gas flow channel 43 are evacuated. In step ST1, the fourth gas flow channel 44 is also evacuated. In step ST1, the primary valve $19_j$ connected to the flow rate controller 18 of the gas supply unit $14_i$ is closed, and the secondary valve $20_j$ connected to the flow rate controller $18_j$ of the gas supply unit $14_i$ is opened. Further, in step ST1, the valve 22 of the gas supply unit $14_i$, the first valve 51, the second valve 52, the third valve 53, and the valve $58_i$ are opened. The fourth valve 54 is closed. As a result, in step ST1, the first gas flow channel 21, the second gas flow channel 42, the third gas flow channel 43, and the fourth gas flow channel 44 are connected to the exhaust apparatus $16_i$ and evacuated.

In the subsequent step ST2, the primary valve $19_j$ connected to the flow rate controller $18_j$ of the gas supply unit $14_i$ is opened, and the supply of a gas from the flow rate controller $18_j$ is started. In the subsequent step ST3, the secondary valve $20_j$ connected to the flow rate controller $18_j$ of the gas supply unit $14_i$ and the second valve 52 are closed. In step ST3, the second valve 52 is closed by control that the second controller SCU performs. In step ST3, the secondary valve $20_j$ of the gas supply unit $14_i$ is closed by the second controller SCU controlling the relay $RL_j$ provided on the corresponding wiring $84_j$. A first state where a gas output from the flow rate controller $18_j$ of the gas supply unit $14_i$ is confined between the secondary valve $20_j$ of the gas supply unit $14_i$ and the second valve 52, that is, in the first gas flow channel 21 of the gas supply unit $14_i$, the second gas flow channel 42, and the third gas flow channel 43 is formed by the execution of step ST3.

In the subsequent step ST4, a measured value $P_{11}$ of a pressure is acquired. The measured value $P_{11}$ is a measured value of a pressure in the third gas flow channel 43 in the first state. The measured value $P_{11}$ is a measured value acquired by the pressure sensor 47 or the pressure sensor 48. The measured value $P_{11}$ may be an average value between the measured value acquired by the pressure sensor 47 and the measured value acquired by the pressure sensor 48. In step ST4, the measured value $P_{11}$ may be acquired when the measured value acquired by the pressure sensor 47 and/or the pressure sensor 48 is stabilized. It is determined that the measured value acquired by the pressure sensor 47 and/or the pressure sensor 48 is stabilized in a case where the amount of fluctuation thereof is equal to or less than a predetermined value.

In the subsequent step ST5, the secondary valve 20$_j$ connected to the flow rate controller 18$_j$ of the gas supply unit 14$_i$ and the second valve 52 are opened. In the subsequent step ST6, a pressure in the first gas flow channel 21 of the gas supply unit 14$_i$, the second gas flow channel 42, and the third gas flow channel 43 is increased. Specifically, in step ST6, the second valve 52 is closed. That is, in step ST6, a second state where a gas is supplied to the first gas flow channel 21 of the gas supply unit 14$_i$, the second gas flow channel 42, and the third gas flow channel 43 from the flow rate controller 18$_j$ of the gas supply unit 14$_i$, and the second valve 52 is closed is formed. In the second state, a pressure in the first gas flow channel 21 of the gas supply unit 14$_i$, the second gas flow channel 42, and the third gas flow channel 43 rises.

In the subsequent step ST7, the secondary valve 20$_j$ connected to the flow rate controller 18$_j$ of the gas supply unit 14$_i$ is closed. In step ST7, the secondary valve 20$_j$ of the gas supply unit 14$_i$ is closed by the second controller SCU controlling the relay RL$_j$ provided on the corresponding wiring 84$_j$. As a result of the execution of step ST7, a third state is formed.

In the subsequent step ST8, a measured value P$_{12}$ and a measured value T$_{12}$ are acquired. The measured value P$_{12}$ is a measured value of a pressure in the third gas flow channel 43 in the third state. The measured value P$_{12}$ is a measured value acquired by the pressure sensor 47 or the pressure sensor 48. The measured value P$_{12}$ may be an average value between the measured value acquired by the pressure sensor 47 and the measured value acquired by the pressure sensor 48. The measured value T$_{12}$ is a measured value of a temperature in the third gas flow channel 43 in the third state. The measured value T$_{12}$ is a measured value acquired by the temperature sensor 49. In step ST8, the measured value P$_{12}$ and the measured value T$_{12}$ may be acquired when the measured value acquired by the pressure sensor 47 and/or the pressure sensor 48 is stabilized and the measured value acquired by the temperature sensor 49 is stabilized. It is determined that the measured value acquired by the pressure sensor 47 and/or the pressure sensor 48 is stabilized in a case where the amount of fluctuation thereof is equal to or less than a predetermined value. In addition, it is determined that the measured value acquired by the temperature sensor 49 is stabilized in a case where the amount of fluctuation thereof is equal to or less than a predetermined value.

In the subsequent step ST9, the first valve 51 and the third valve 53 are closed. In the subsequent step ST10, the second valve 52 is opened. That is, in step ST10, the second valve 52 is opened and the first valve 51 is closed, so that a fourth state is formed from the third state. In the fourth state, a gas in the third gas flow channel 43 is at least partially discharged. In the fourth state according to an embodiment, the gas in the third gas flow channel 43 is partially discharged to the fourth gas flow channel 44. In the fourth state according to another embodiment, the gas in the third gas flow channel 43 may be completely discharged through the fourth gas flow channel 44.

In the subsequent step ST11, the second valve 52 is closed, so that a fifth state is formed from the fourth state. In an embodiment, the gas in the third gas flow channel 43 is partially discharged in the above-described fourth state, so that a pressure in the third gas flow channel 43 in the fifth state may be set to be higher than a pressure in the evacuated third gas flow channel 43. In this embodiment, the fifth state is formed by a gas confined in the third gas flow channel 43 being partially discharged in the third state, that is, without being completely discharged. Therefore, a time length required for forming the fifth state from the third state is shortened. In an embodiment, step ST11a for opening the third valve 53 is added after step ST11 and steps ST9 to ST11a are repeated, so that a pressure in the third gas flow channel 43 may be reduced.

In the subsequent step ST12, a measured value P$_{13}$ of a pressure is acquired. The measured value P$_{13}$ is a measured value of a pressure in the third gas flow channel 43 in the fifth state. The measured value P$_{13}$ is a measured value acquired by the pressure sensor 47 or the pressure sensor 48. The measured value P$_{13}$ may be an average value between the measured value acquired by the pressure sensor 47 and the measured value acquired by the pressure sensor 48. In step ST12, the measured value P$_{13}$ may be acquired when the measured value acquired by the pressure sensor 47 and/or the pressure sensor 48 is stabilized. It is determined that the measured value acquired by the pressure sensor 47 and/or the pressure sensor 48 is stabilized in a case where the amount of fluctuation thereof is equal to or less than a predetermined value.

In the subsequent step ST13, the first valve 51 is opened, so that a sixth state is formed from the fifth state. In the subsequent step ST14, a measured value P$_{14}$ of a pressure is acquired. The measured value P$_{14}$ is a measured value of a pressure in the third gas flow channel 43 in the sixth state. The measured value P$_{14}$ is a measured value acquired by the pressure sensor 47 or the pressure sensor 48. The measured value P$_{14}$ may be an average value between the measured value acquired by the pressure sensor 47 and the measured value acquired by the pressure sensor 48. In step ST14, the measured value P$_{14}$ may be acquired when the measured value acquired by the pressure sensor 47 and/or the pressure sensor 48 is stabilized. It is determined that the measured value acquired by the pressure sensor 47 and/or the pressure sensor 48 is stabilized in a case where the amount of fluctuation thereof is equal to or less than a predetermined value.

In the subsequent step ST15, the flow rate Q is determined. The flow rate Q is a flow rate of a gas output from the flow rate controller 18$_j$ of the gas supply unit 14$_i$ in the second state. In step ST15, an arithmetic operation of the following Expression (1) is executed in order to determine the flow rate Q.

$$Q=(P_{12}-P_{11})/\Delta t \times (1/R) \times (V/T) \tag{1}$$

In Expression (1), $\Delta t$ denotes a time length of an execution period of step ST6. Specifically, $\Delta t$ is a time length from a time when the second state is formed, that is, from the time when the second valve 52 is closed in step ST6, to a time when the relay RL$_j$ is controlled by the second controller SCU in the step ST7 to form the third state described above. In Expression (1), R denotes a gas constant, and (V/T) includes $\{V_3/T_{12} \times (P_{12}-P_{13})(P_{12}-P_{14})\}$.

In an embodiment, a specific arithmetic operation of step ST15 is an arithmetic operation of the following Expression (1a).

$$Q=(P_{12}-P_{11})/\Delta t \times (1/R) \times \{V_{st}/T_{st}+V_3/T_{12} \times (P_{12}-P_{13})/(P_{12}-P_{14})\} \tag{1a}$$

In Expression (1a), $V_{st}$ denotes the volume of a flow channel between an orifice member of the flow rate controller 18$_j$ of the gas supply unit 14$_i$ and the valve of the secondary valve 20$_j$, and is a design value which is set in advance. T$_{st}$ denotes a temperature in the flow channel between the orifice member of the flow rate controller 18$_j$ of the gas supply unit 14$_i$ and the valve of the secondary valve 20$_j$, and is acquired by a temperature sensor of the flow rate controller 18$_j$. T$_{st}$ may be a temperature to be acquired in the third state. In Expression (1a), (V$_{st}$/T$_{st}$) may be omitted.

In the method MT, a pressure rise is caused by supplying a gas from one flow rate controller 18$_j$ of one gas supply unit 14$_i$ to the first gas flow channel 21 of the gas supply unit 14$_i$, the second gas flow channel 42, and the third gas flow channel 43 in a state where the second valve 52 is closed. The rate of this pressure rise, that is, the rate of rise in pressure is used in Expression (1), so that a flow rate of a gas output from the flow rate controller 18$_j$ is determined. In Expression (1), V/T should include a sum of (V$_E$/T$_E$) and (V$_3$/T$_{12}$). That is, the arithmetic operation of Expression (1) should be the following Expression (1b).

$$Q=(P_{12}-P_{11})/\Delta t \times (1/R) \times (V_{st}/T_{st}+V_E/T_E+V_3/T_{12}) \quad (1b)$$

Here, V$_E$ denotes the sum of the volume of the first gas flow channel 21 of the gas supply unit 14$_i$ and the volume of the second gas flow channel 42, and T$_E$ denotes temperature in the first gas flow channel 21 of the gas supply unit 14$_i$ and the second gas flow channel 42 in the third state.

Here, the following Expression (4) is established from the Boyle-Charle's law.

$$P_{12} \times V_E/T_E + P_{13} \times V_3/T_{12} = P_{14} \times V_E/T_E + P_{14} \times V_3/T_{12} \quad (4)$$

From Expression (4), the sum of (V$_E$/T$_E$) and (V$_3$/T$_{12}$) is represented as shown in the following Expression (5).

$$V_E/T_E+V_3/T_{12}=V_3/T_{12}+V_3T_{12} \times (P_{14}-P_{13})/(P_{12}-P_{14})$$
$$=V_3/T_{12} \times (P_{12}-P_{13})/(P_{12}-P_{14}) \quad (5)$$

Therefore, in Expression (1), V$_3$/f$_{12}$×(P$_{12}$−P$_{13}$)/(P$_{12}$−P$_{14}$) can be used instead of the sum of (V$_E$/T$_E$) and (V$_3$/T$_{12}$).

In the substrate processing system, since the first gas flow channel 21 is disposed inside the housing 17, a temperature in the first gas flow channel 21 is less influenced by the surrounding environment. In addition, since the third gas flow channel 43 is connected to the first gas flow channel 21 through the second gas flow channel 42, the third gas flow channel 43 may be disposed in a region away from the plurality of chambers 12. Therefore, a temperature in the third gas flow channel 43 is less influenced by the plurality of chambers 12. On the other hand, the second gas flow channel 42 may be influenced by the surrounding environment, for example, the temperature of any of the plurality of chambers 12, and a temperature variation may also exist in the second gas flow channel 42. In addition, the temperature variation cannot be measured accurately with the temperature sensor. In the method MT, V$_3$/T$_{12}$×(P$_{12}$−P$_{13}$)/(P$_{12}$−P$_{14}$) is used in Expression (1) instead of the sum of (V$_E$/T$_E$) and (V$_3$/T$_{12}$). That is, in the method MT, in the calculation of the flow rate Q, it is possible to use a measured value acquired from a location which is not likely to be influenced by temperature from the surrounding environment and has no temperature variation. Therefore, according to the method MT, it is possible to determine the flow rate Q with a high degree of accuracy.

Further, in the method MT, a sixth state is formed by diffusing gases confined in the first gas flow channel 21 and the second gas flow channel 42 in the third state to the third gas flow channel 43, and a measured value P$_{14}$ is acquired in the sixth state. That is, a gas used for forming a state during the acquisition of the measured value P$_{12}$ is reused for forming a state during the acquisition of the measured value P$_{14}$. Therefore, it is possible to efficiently determine the flow rate Q.

In the method MT, the closing of the secondary valve 20$_j$ in step ST7 determining the time when the execution period of step ST6 ends is realized by the second controller SCU controlling the relay RL$_j$. That is, the closing of the secondary valve 20$_j$ in step ST7 is realized by control of the second controller SCU without the first controller MCU. Therefore, delay of the control to close the secondary valve 20$_j$ in step ST7 is suppressed. As a result, it is possible to accurately specify the time length (Δt) of the execution period of step ST6, that is, the time length of the period during which the pressure within the third gas flow channel 43 rises, and to accurately determine the flow rate Q of the gas based on the time length.

The flow rate Q may be determined for all of the flow rate controllers 18 of the gas supply unit 14$_i$. In addition, the method MT may be executed in order for all of the plurality of gas supply units 14. In a case where the method MT is executed for the gas supply unit 14$_{N+1}$, a pressure in each gas flow channel of a gas output from the flow rate controller 18$_1$ of the gas supply unit 14$_{N+1}$ is set to be a pressure lower than saturated vapor pressure of the gas. Meanwhile, the pressure of the gas which is set to be pressure lower than the saturated vapor pressure may be the pressure of a single gas in a case where a gas generated by the vaporization of liquid is used as a single gas. In a case where a mixed gas of the gas generated by the vaporization of liquid and another gas is used, the pressure of the gas which is set to be pressure lower than the saturated vapor pressure is partial pressure of the gas generated by the vaporization of liquid.

Hereinbefore, various embodiments are described. However, various modifications may be made without being limited to the above-described embodiments. For example, a substrate processing system in a modified embodiment may not include the gas supply unit 14$_{N+1}$.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system comprising:
a substrate processing apparatus;
a measurement apparatus configured to measure a flow rate of a gas used in the substrate processing apparatus;
a first controller configured to control the substrate processing apparatus and the measurement apparatus; and
a wiring connected to the first controller,
wherein the substrate processing apparatus includes
a chamber,
a gas supply unit configured to supply a gas to an internal space of the chamber, the gas supply unit including a flow rate controller, a primary valve connected to a primary side of the flow rate controller, a secondary valve connected to a secondary side of the flow rate controller, and a first gas flow channel including a first end, a second end, and a third end, the first end being connected to the secondary valve and the third end being connected to the internal space of the chamber through an on/off valve, and an exhaust apparatus connected to the internal space of the chamber through an exhaust flow channel, wherein the first controller is configured to control opening and closing of each of the primary valve and the secondary valve, designate the flow rate of the gas to the flow rate controller, and instruct the measurement apparatus to measure the flow rate of the gas, the measurement apparatus includes
- a second gas flow channel including a fourth end and a fifth end, the fourth end being connected to the second end of the gas supply unit,
- a third gas flow channel including a sixth end and a seventh end,
- a first valve connected between the fifth end of the second gas flow channel and the sixth end of the third gas flow channel,
- a second valve connected to the seventh end of the third gas flow channel and provided to be capable of being connected to the exhaust apparatus,
- one or more pressure sensors configured to measure a pressure within the third gas flow channel,
- a temperature sensor configured to measure a temperature within the third gas flow channel, and
- a second controller configured to control opening and closing of each of the first valve and the second valve and perform measurement of the flow rate based on an instruction from the first controller, and wherein the first controller is configured to output a voltage through the wiring to open the secondary valve, the measurement apparatus includes a relay provided on the wiring, and the second controller is configured to control the relay.

2. The substrate processing system according to claim 1, wherein the gas supply unit further includes a solenoid valve,
the wiring connects the first controller and the solenoid valve to each other,
the solenoid valve is configured to supply an air to the secondary valve when the voltage output from the first controller is applied to a solenoid thereof, and stop supplying an air to the secondary valve when the voltage is not applied to the solenoid, and
the secondary valve is driven by the air so that the secondary valve is opened when the air is supplied from the solenoid valve and closed when no air is supplied from the solenoid valve.

3. A method of determining a flow rate of a gas in the substrate processing system according to claim 1, the method comprising:

acquiring a measured value $P_{11}$ of a pressure within the third gas flow channel using the one or more pressure sensors in a first state where the secondary valve and the second valve are closed, and the first valve is opened when a gas is supplied from the flow rate controller to the first gas flow channel, the second gas flow channel, and the third gas flow channel;

raising a pressure in the first gas flow channel, the second gas flow channel, and the third gas flow channel by forming a second state where the second valve is closed by control of the second controller when a gas is supplied from the flow rate controller to the first gas flow channel, the second gas flow channel, and the third gas flow channel;

forming a third state where the secondary valve is closed by the second controller controlling the relay, after said raising a pressure;

acquiring a measured value $P_{12}$ of a pressure within the third gas flow channel and a measured value $T_{12}$ of a temperature within the third gas flow channel in the third state, using the one or more pressure sensors and the temperature sensor, and calculating a flow rate of the gas output from the flow rate controller in said raising a pressure by the second controller, using a value obtained by dividing a difference between the measured values $P_{12}$ and $P_{11}$ by a time length of an execution period of said raising a pressure and the measured value $T_{12}$, wherein the time length is a time length from a time when the second state is formed to a time when the relay is controlled by the second controller to form the third state.

4. The method according to claim 3, further comprising:

evacuating the first gas flow channel, the second gas flow channel, and the third gas flow channel in a state where the secondary valve, the first valve, and the second valve are opened, wherein the measured value $P_{11}$ is a pressure within the third gas flow channel measured by using one or more pressure sensors in the first state, formed by the second valve being closed by the second controller and the secondary valve being closed by the second controller controlling the relay when a gas is supplied from the flow rate controller to the first gas flow channel, the second gas flow channel, and the third gas flow channel, from the state formed in the evacuating.

5. The method according to claim 3, further comprising:

forming a fourth state where the second valve is opened and the first valve is closed, from the third state;

forming a fifth state where the second valve is closed, from the fourth state;

acquiring a measured value $P_{13}$ of a pressure within the third gas flow channel in the fifth state, using the one or more pressure sensors;

forming a sixth state where the first valve is opened, from the fifth state; and acquiring a measured value $P_{14}$ of a pressure within the third gas flow channel in the sixth state, using the one or more pressure sensors, wherein a flow rate Q of the gas output from the flow rate controller in the second state is determined in said calculating a flow rate of the gas by executing an arithmetic operation of the following Expression (1), $$Q=(P_{12}-P_{11})/\Delta t \times (1/R) \times (V/T) \qquad (1)$$

in Expression (1), $\Delta t$ is a time length of an execution period of said raising a pressure, R is a gas constant, (V/T) includes $\{V_3/T_{12} \times (P_{12}-P_{13})/(P_{12}-P_{14})\}$, and $V_3$ is a default value of a volume of the third gas flow channel.

* * * * *